(12) United States Patent
Lojek (10) Patent No.: US 7,253,057 B1
(45) Date of Patent: Aug. 7, 2007

(54) MEMORY CELL WITH REDUCED SIZE AND STANDBY CURRENT

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/399,137

(22) Filed: Apr. 6, 2006

(51) Int. Cl.
*H01L 21/336* (2006.01)

(52) U.S. Cl. .................... 438/264; 438/258; 438/594; 438/947

(58) Field of Classification Search ........ 438/257–258, 438/263–264, 593–594, 947
See application file for complete search history.

(56) References Cited

U.S. PATENT DOCUMENTS

| | | | |
|---|---|---|---|
| 5,313,421 A | 5/1994 | Guterman et al. | 365/185 |
| 5,516,713 A * | 5/1996 | Hsue et al. | 438/261 |
| 5,712,180 A | 1/1998 | Guterman et al. | 437/43 |
| 5,756,385 A * | 5/1998 | Yuan et al. | 438/258 |
| 5,776,810 A | 7/1998 | Guterman et al. | 438/258 |
| 5,847,996 A | 12/1998 | Guterman et al. | 365/185.28 |
| 5,883,409 A | 3/1999 | Guterman et al. | 257/316 |
| 5,910,915 A | 6/1999 | Guterman et al. | 365/185.28 |
| 5,910,925 A | 6/1999 | Guterman et al. | 365/230.01 |
| 5,972,752 A * | 10/1999 | Hong | 438/264 |
| 6,002,152 A | 12/1999 | Guterman et al. | 257/316 |
| 6,506,646 B1 * | 1/2003 | Miyagi | 438/257 |
| 6,579,808 B2 * | 6/2003 | Cho et al. | 438/725 |
| 6,664,587 B2 | 12/2003 | Guterman et al. | 257/315 |
| 6,861,700 B2 | 3/2005 | Guterman et al. | 257/321 |
| 6,954,381 B2 | 10/2005 | Guterman et al. | 365/185.28 |
| 7,105,455 B2 * | 9/2006 | Yoo | 438/723 |
| 7,132,329 B1 * | 11/2006 | Hong et al. | 438/257 |
| 2002/0039822 A1 * | 4/2002 | Kusumi et al. | 438/264 |

* cited by examiner

*Primary Examiner*—Zandra V. Smith
*Assistant Examiner*—Toniae M. Thomas
(74) *Attorney, Agent, or Firm*—Schneck & Schneck; Thomas Schneck (57) ABSTRACT

A present invention is a method, and resulting device, for fabricating memory cells with an extremely small area and reduced standby current. The small area is accomplished by a judicious use of spacers which allows a tunnel window of a storage device to be fabricated in close proximity to an associated select gate and with a reduced gate width compared to typical devices. The tunnel window is recessed within an upper surface of a substrate. The tunnel window recess is made possible by selective etching of the substrate and oxides covering the substrate. A substantial reduction in the size of a tunnel window means device scaling is possible far beyond what is attainable with standard photolithography. Standby current is reduced significantly by fabricating a select device with complementary material types for the gate compared with the adjacent source/drain regions.

13 Claims, 5 Drawing Sheets

MEMORY CELL WITH REDUCED SIZE AND STANDBY CURRENT

TECHNICAL FIELD

The invention relates to non-volatile memory cell and memory arrays and, in particular, to a compact architectural arrangement for fabrication of non-volatile memory devices with low standby current and a method of making same.

BACKGROUND ART

A non-volatile memory device retains data even after power to the device is terminated. One particular type of non-volatile memory device is an electrically erasable programmable read only memory (EEPROM) device. In an EEPROM device, programming and erasing are accomplished by transferring electrons to and from a floating gate electrode through a thin dielectric layer, known as a tunnel-oxide layer, located between the floating gate electrode and an underlying substrate. Typically, electron transfer is carried out by either hot electron injection or by Fowler-Nordheim tunneling. In either electron transfer mechanism, a voltage is coupled to the floating gate electrode by a control gate electrode, also known as a programming region. The control gate electrode or programming region is capacitively coupled to the floating gate electrode such that a voltage applied to the programming region is coupled to the floating gate electrode.

A traditional EEPROM device utilizes the floating gate, in a field effect transistor structure, positioned over but insulated from a channel region in the semiconductor substrate, and between source and drain regions. A threshold voltage characteristic of the transistor is controlled by an amount of charge that is retained on the floating gate. Thus, a minimum amount of voltage (i.e., the threshold voltage) must be applied to the control gate before the transistor is turned "on," thus permitting conduction between source and drain regions of the transistor. Conduction is controlled by the amount of charge on the floating gate. A memory transistor is programmed or erased to one of two states by transferring electrons from the substrate channel region, through a tunnel window constructed in the thin dielectric tunnel layer and onto and from the floating gate.

A state of the memory transistor is read by placing an operating voltage across the source and drain with an additional voltage on the control gate of the memory transistor. A level of current flowing between the source and drain is detected to determine whether the device is programmed to be "on" or "off" for a given control gate voltage. A specific single memory transistor cell in a two-dimensional array of EEPROM memory cells is addressed for reading by (1) applying a source-drain voltage to source and drain lines in a column containing the cell being addressed, and; (2) applying a control gate voltage to the control gates in a row containing the cell being addressed.

As discussed, EEPROM memory cells may be erased electrically. One way in which the cell is erased electrically is by transfer of charge from the floating gate to the transistor drain through a thin tunnel dielectric layer. Charge transfer is again accomplished by applying appropriate voltages to the source, drain, and control gate of the floating gate transistor. An array of EEPROM cells is generally referred to as a Flash EEPROM array because an entire array of cells, or a significant group of cells, is erased simultaneously.

As Flash EEPROM arrays become increasingly larger in terms of storage capacity, the semiconductor industry has attempted various ways of reducing a size of individual memory cells, and thus, reducing a size of the entire array. The size reduction however cannot impact reliability nor critical characteristics of the memory device such as standby current. The reduction in size of individual memory cells means an overall reduction in the area of the memory array. With more devices available in a given area, it is critical that each device maintains as low a standby current as possible.

Traditionally, EEPROM cell size has been limited by the required width of the active region. A primary limiting factor in determining the active region width is the size of the tunnel window. Traditionally, the tunnel window is defined by lithography which produces a limitation on a minimum aperture size for the tunnel window. The active area is required by process design rules to extend beyond this minimum aperture size. Consequently, this requirement determines a minimum width of the memory device conduction channel. To achieve a maximum of saturation current through the conduction channel, it is desirable to maximize the ratio of width to length of the memory device.

The lithographic limits in determining the minimum width of the tunnel window also determine a minimum width of the memory device. With the width of the memory device determined, the length of the memory device is also determined. The constraints determined by the feature size of the tunnel window therefore produce a limitation on the scalability of the EEPROM cell and in turn limit the ability to minimize the memory cell size.

It would be desirable to achieve an enhancement to a tunnel window fabrication process which would further reduce the minimum aperture size of the tunnel diode window. A further reduction in the minimum feature size of the tunnel window directly affects the minimum features of a memory device. A further reduction in tunnel window size would enhance the scalability of the EEPROM memory cell. Additionally it would be further desirable to achieve the reduction in minimal feature size while maintaining an extremely low standby current.

SUMMARY

The present invention is a method, and resulting device, for fabricating memory cells with an extremely small area and low standby current. The small area requirement is met due primarily to two significant factors. First, a judicious use of spacers, described in detail infra, allows a tunneling window to be fabricated with feature sizes less than comparable features produced by conventional lithography. Using spacers, a tunneling window may be fabricated with an aperture significantly smaller than the limits set by optical photolithography.

The low standby current requirement is met by two factors as well. First the scaling capability, besides offering reduced feature sizes, also means that an amount of standby current is reduced due to smaller device geometries. Secondly a device width of a select gate of the memory device can be narrowed independent of the width of the storage device. The work function of the select gate is proportional to the standby current. Experimental evidence suggests an appropriate work function of the select gate produces a significantly lower standby current.

In one exemplary embodiment, the present invention is a method of fabricating an electronic integrated circuit device on a first surface of a substrate (e.g., a silicon wafer). The method includes forming a first dielectric layer, such as silicon dioxide (e.g., thermally or deposited). At least one additional dielectric film layer is then formed over the first dielectric film layer. An aperture is created and spacers are formed on sidewalls of the aperture. The spacers are produced such that a distance between spacers on opposing sidewalls of the aperture is less than a limit of optical photolithography. An injector dopant region is then formed within the aperture created by the spacers and a portion of the area immediately adjacent. The first dielectric film layer and an upper portion of the substrate underlying the second aperture are etched and covered with a dielectric layer, thus forming the tunneling window.

DETAILED DESCRIPTION

With reference to FIGS. 1A-1E, advanced spacer fabrication techniques are described in detail. The spacer fabrication technique is described with regard to a simplified topology to clearly describe and define various process steps. Although the simplified topology is a variation of a topology actually employed in the present invention, the simplified topology fabrication steps are described so as to more clearly describe the technique.

Figure 1A:
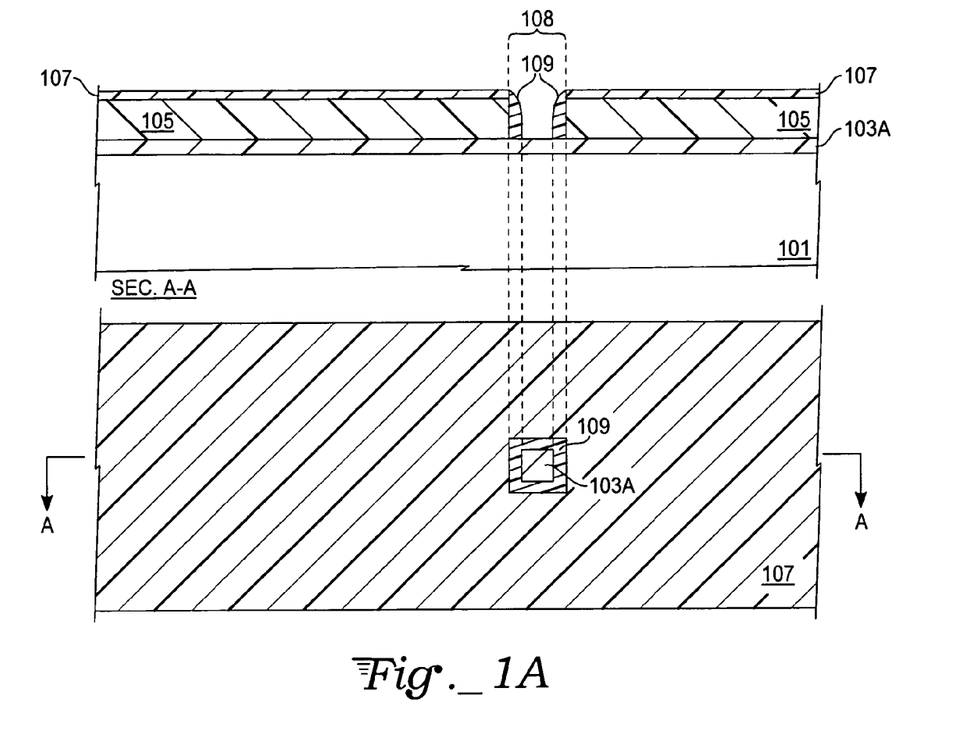
FIGS. 1A-1H are an exemplary embodiment of process steps employing a spacer application and tunneling window fabrication technique used in the present invention.

A cross-section A-A of FIG. 1A includes a substrate 101, a first dielectric layer 103A, a second dielectric layer 105, and a third dielectric layer 107 in an exemplary embodiment of the present invention. The second dielectric layer 105 and the third dielectric layer 107 contain a first aperture 108. The substrate 101 may be comprised of various materials known in the semiconductor art. Such materials include silicon (or other group IV materials), compound semiconductors (e.g., compounds of elements, especially elements from periodic table groups III-V and II-VI), quartz reticles, or other suitable materials.

In a specific exemplary embodiment, the substrate 101 is a p-type silicon wafer (or alternatively, a p-type well in a substrate). The first dielectric layer 103A is a silicon dioxide layer and may be formed by a thermal oxidation technique or alternatively may be deposited by any of a variety of techniques such as atomic layer deposition (ALD), chemical vapor deposition (CVD), low-pressure CVD (LPCVD), plasma-enhanced CVD (PECVD), or plasma-assisted CVD (PACVD). In this specific exemplary embodiment, the second dielectric layer 105 and third dielectric layer 107 are substantially comprised of silicon nitride and TEOS oxide (tetra-ethoxysilane or tetraethyl orthosilicate) respectively.

A selective etchant, such as a highly selective dry etch or wet chemical etch is chosen to etch the third dielectric layer 107 and the second dielectric layer 105, thus forming a first aperture 108. Etching of underlying layers can occur through various wet-etch techniques (e.g., the first dielectric layer 103A may be etched in hydrofluoric acid, such as contained in a standard buffered oxide etch (BOE), or orthophosphoric acid) or dry etch techniques (e.g., reactive-ion-etching (RIE)). A skilled artisan will recognize that various chemistries may be chosen which will readily etch, for example, a polysilicon layer while leaving a nitride layer essentially intact (or vice versa) or etch a nitride layer while leaving a silicon dioxide layer intact (or vice versa). Therefore, etches of one layer may be performed while leaving adjacent layers intact while avoiding tedious and critical timing steps. Layers comprised of materials dissimilar to the layer being etched thus serve as an etch stop. Such etching techniques are known in the semiconductor art. In this exemplary embodiment, one or more selective etchants are chosen such that there is a high selectivity of etch rate between the second and third dielectric layers 105, 107 and the underlying first dielectric layer 103A. Therefore, due to the selectivity of the etchant itself there is no need for critical timing as the first dielectric layer 103A acts as an etch stop for the second and third dielectric layers 105, 107. This selective etch capability is used to produce the first aperture 108 and similar techniques are used in subsequent process steps.

A blanket dielectric spacer layer (not shown) is formed for example, by CVD or LPCVD techniques. In a specific exemplary embodiment, the dielectric spacer layer is chosen to be chemically dissimilar to the underlying etched third dielectric layer 107. For example, if the etched third dielectric layer 107 is chosen to be TEOS oxide, then the dielectric spacer layer may be chosen to be silicon nitride. In this way, an etchant which is selective between silicon dioxide and silicon nitride allows the etched third dielectric (e.g., TEOS oxide) layer 107 to act as an etch stop for etching a dielectric spacer 109 from the spacer dielectric (e.g., silicon nitride) layer.

This first spacer etch step is exemplified with reference to both the plan view and a cross-sectional view A-A of FIG. 1A. In a case where dissimilar materials are used for the etched third dielectric layer 107 and the spacer dielectric layer, a dielectric spacer 109 is formed on the first aperture sidewalls by a selective etchant. The selective etchant is used to etch the dielectric spacer 109 without substantially affecting an integrity of any other layer.

Etching of the spacer layer is performed such that substantially all horizontal surfaces (i.e., those parallel to the face of the substrate) are etched while leaving surfaces that are essentially vertical substantially intact. The resulting width of the dielectric spacer 109 is essentially the thickness of the spacer dielectric layer deposited before selective etching. In the present exemplary embodiment the dielectric spacer 109 is a thickness of 500 Å, a thickness of the second dielectric (i.e., a step thickness) is 1000 Å, and a thickness of the first dielectric layer 103A is 100-200 Å. Such etches, as those of the spacer dielectric layer, are accomplished by, for example, a reactive ion etch. The plan view of FIG. 1A indicates both a size of the second aperture through the spacer layer and visible layers. The layers visible at this stage of fabrication are the patterned dielectric spacer 109, the third dielectric layer 107, and the substrate 101.

Generally, typical photolithographic techniques are limited by physical constraints of the photolithographic system involving actinic radiation wavelength, λ, and geometrical configurations of the projection system optics. According to Rayleigh's criterion, $$L_r = \frac{0.61\lambda}{NA}$$

where NA is the numerical aperture of the optical system and is defined as NA=n sin α, where n is the index of refraction of the medium which the radiation traverses (usually air for this application, so n≈1) and α is a half-angle of divergence of the actinic radiation. For example, using deep ultraviolet (DUV) illumination with λ=193 nm, and NA=0.7, the lower limit of resolution is 168 nanometers (1680 Å). Techniques such as phase-shifted masks can extend this limit downward, but photomasks required employing this technique are extremely expensive. This expense becomes greatly compounded with a realization that an advanced semiconductor process may employ more than 25 photomasks.

A "width" of the dielectric spacer 109 is dependent upon a thickness of the deposited spacer layer and a step height of a proximate structure; the dielectric spacer 109 is approximately 0.7·t, where "t" is the thickness of the combined thicknesses of the etched second and third dielectric layers 105, 107. Thus, the width of the spacers and, consequently any underlying features, may be fabricated to be extremely small. Therefore, the fabrication method described herein, and a device resulting from employing the method, may have components that are formed below a limit of resolution of optical photolithography by utilizing spacers to separate laterally displaced features (i.e., features that have spatial dimensions less than the limit of resolution in planes parallel to a face of a substrate or wafer, or "x-y" dimensions).

The plan view of FIG. 1A indicates how the dielectric spacer 109 can significantly reduce a size of an aperture. For example, compare a size of the first aperture 108 opening onto the third dielectric layer 107 with a size of the second aperture now open to the substrate 101. If the first aperture 108 were at the limit of resolution for a particular photolithographic stepper, in this case, 0.18 µm, and the thickness of the spacer dielectric layer was 100 nm (i.e., 0.10 µm), then the aperture size "S" between the spacers 109 on opposing sidewalls of the original aperture (i.e., the aperture opening onto the substrate 101) is $$S=0.18 \text{ µm}-[2 \cdot \{0.7(0.10 \text{ µm})\}]$$

$$S=0.04 \text{ µm}$$

Thus, the second aperture formed by the dielectric spacers 109 may be significantly less than the limit of resolution of the stepper. An additional benefit is that a select transistor width can also be scaled down to a minimum size, thus keeping current through the device minimized while enabling further scaling capabilities. Further elaboration on a difference in a select gate width versus a storage gate width is discussed infra.

Figure 1B:
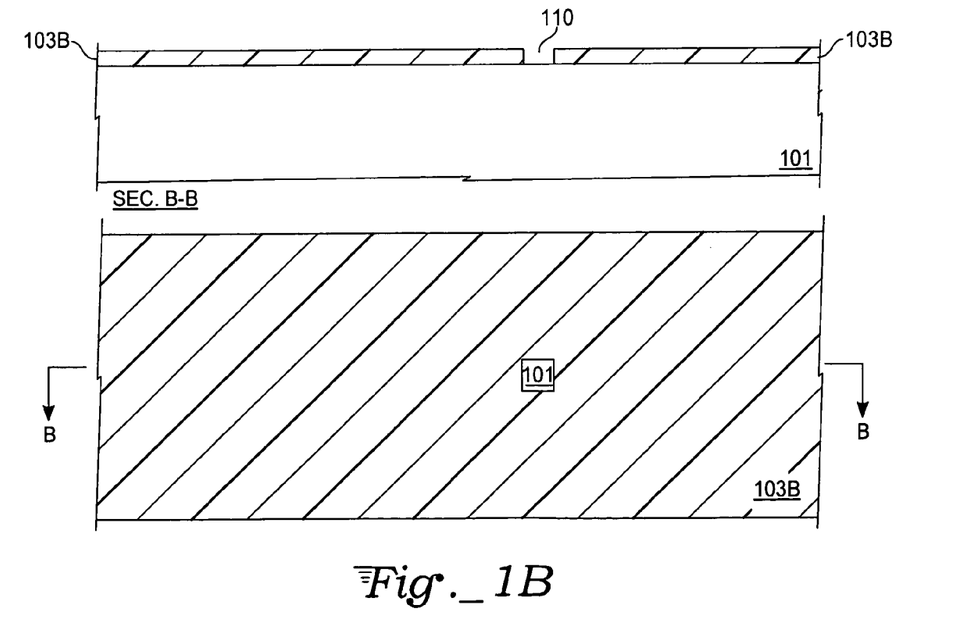

With reference to cross-section B-B of FIG. 1B, in the present exemplary embodiment, the first dielectric layer 103A is etched to form an etched first dielectric layer 103B and an etch aperture 110 exposing a portion of the substrate 101. The second aperture formed by the dielectric spacer 109 (FIG. 1A) is used to perform a selective etch on the first dielectric layer 103A to form the etched first dielectric layer 103B and the etch aperture 110. After the etch aperture 110 is formed by the selective etch, the third dielectric layer 107, the second dielectric layer 105, and the dielectric spacers 109 are removed by a sequence of the etchants such as those mentioned supra.

With reference to the plan view of FIG. 1B, the size of the etch aperture 110 formed by the dielectric spacer exposes a portion of the substrate 101. A relative indication of the small size of the etch aperture 110 is demonstrated.

Figure 1C:
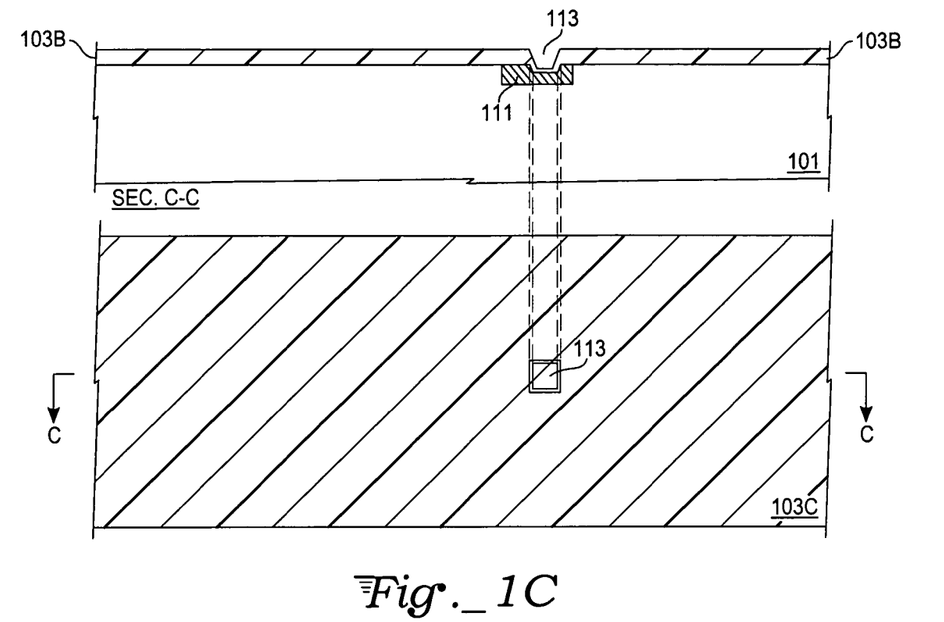

With reference to cross-section C-C of FIG. 1C, in the present exemplary embodiment, the substrate 101 is selectively etched to produce an etched substrate recess 113. To produce the etched substrate recess 113 the substrate 101 is over etched, through the etch aperture 110 (FIG. 1B), to a depth of about 200-300 Å below an uppermost surface of the etched first dielectric layer 103A. A size of the etched substrate recess 113 is roughly the size of the second aperture formed by the dielectric spacer 109. The dielectric spacer 109 thus serves as an etch mask. The dielectric spacer 109 also serves to limit an area for a subsequent dopant step, thereby forming an injector dopant region 111. The injector dopant region 111 may be formed by processes known to a skilled artisan and include techniques such as diffusion and ion implantation. The injector dopant region 111, per the present exemplary embodiment, is made by doping a localized area (e.g., through injector ion implantation) creating a subsurface highly-doped region for receiving bias from a nearby contact for charge generation, i.e., a tunneling injector.

With reference to the plan view of FIG. 1C, a small feature size of the etched substrate recess 113 is carried through to a recessed first dielectric layer 103C with a thin oxide grown over the etched substrate recess 113. The thin oxide is, for example, the same material as the etched first dielectric layer 103B.

Figure 1D:
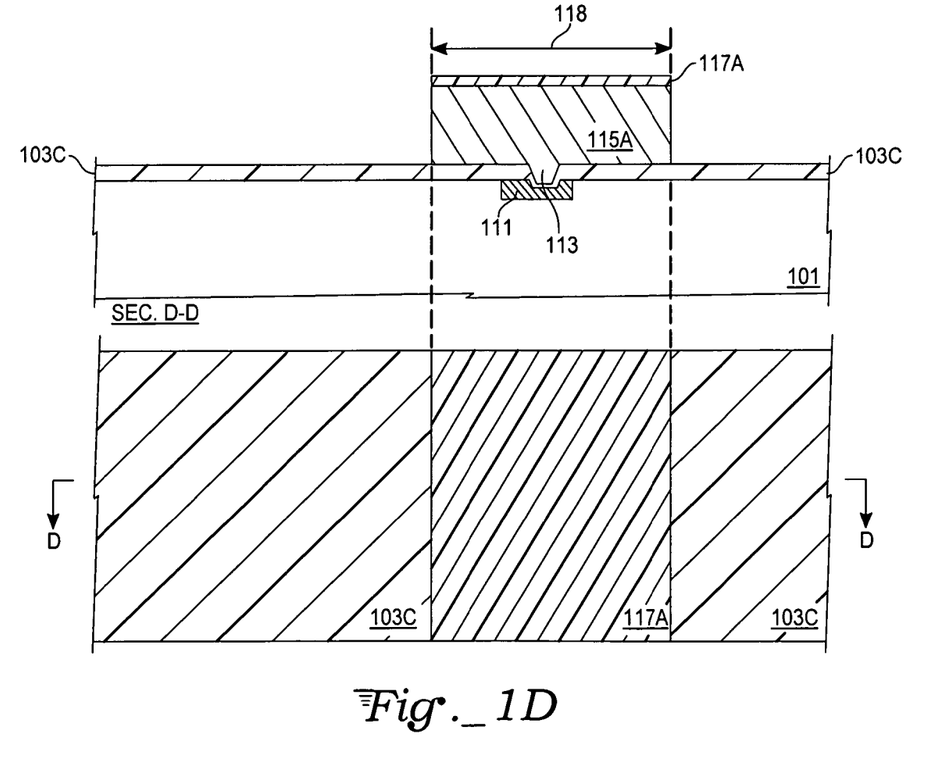

With reference to cross-section D-D of FIG. 1D, in the present exemplary embodiment, an initial floating gate 115A and an initial etched forth dialectic layer 117A are fabricated on the recessed first dielectric layer 103C above the etched substrate recess 113 and the injector dopant region 111 so as to form a floating gate portion of a storage device. Fabrication of the initial floating gate 115A and the initial etched fourth dielectric layer 117A commences with a first semiconductor layer (not shown) being deposited across the first surface of the substrate 101. A subsequent deposition of a fourth dielectric layer (not shown) is applied on top of the first dielectric layer 103B. The first semiconductor layer and the fourth dielectric layer are etched to form the initial floating gate 115A and the initial etched fourth dielectric layer 117A with a non-critical gate length 118. The first semiconductor layer, in the present exemplary embodiment, is a high concentration n-type polysilicon material. With reference to the plan view of FIG. 1D, the initial etched fourth dielectric layer 117A is situated atop the initial floating gate 115A and the recessed first dielectric layer 103C.

Figure 1E:
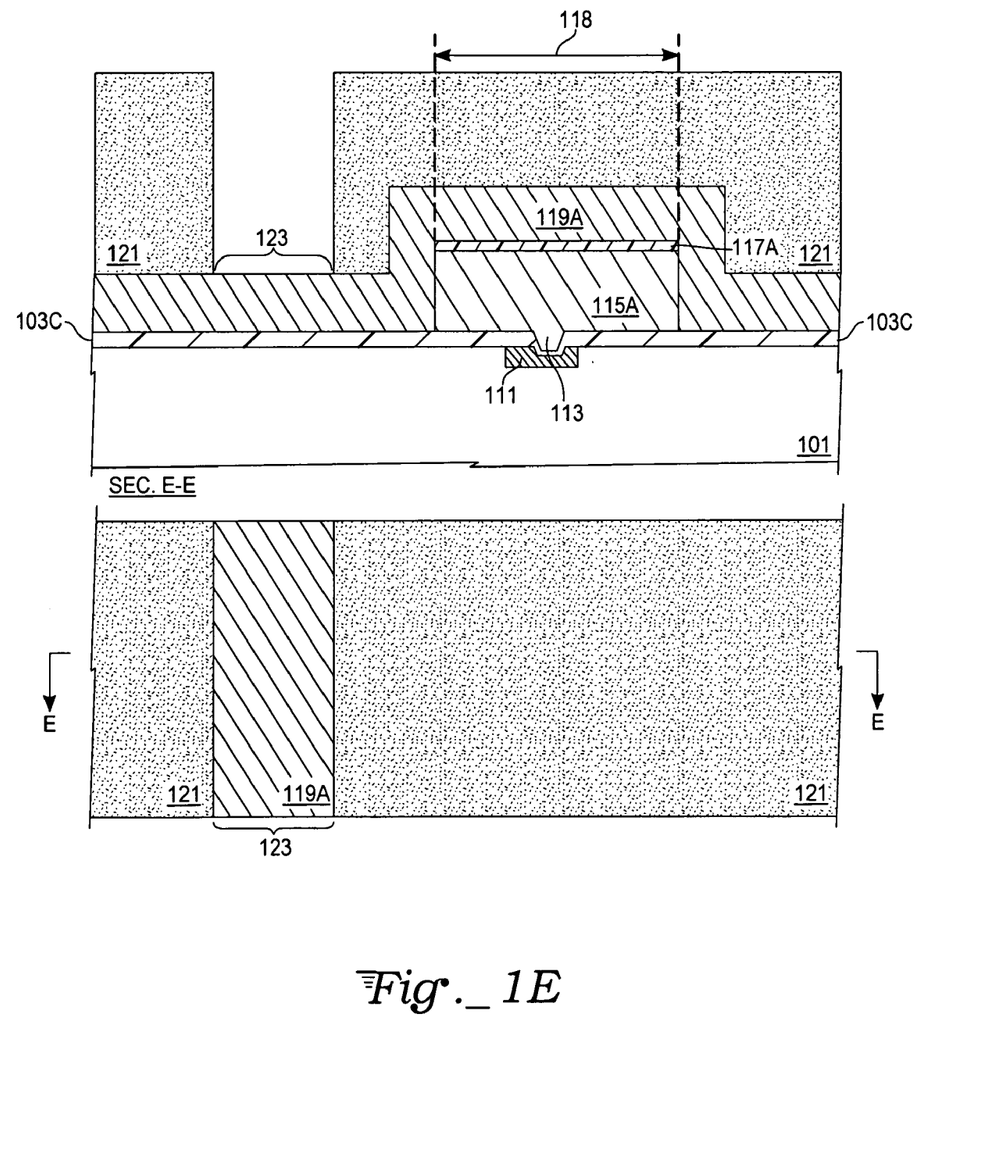

With reference to cross-section E-E of FIG. 1E, in the present exemplary embodiment a second semiconductor layer 119A is deposited in a conformal layer across the upper surface of the recessed first dielectric layer 103C which covers the initial floating gate 115A and the initial etched fourth dielectric layer 117A. In the present exemplary embodiment the second semiconductor layer 119A is an undoped polysilicon material. A photoresist material is deposited on top of the second semiconductor layer 119A and is processed to form a patterned photoresist layer 121.

In the plan view of FIG. 1E, the patterning of the patterned photoresist layer 121 produces a select gate region 123 in close proximity to the floating gate portion (i.e., the initial floating gate 115A and the initial etched fourth dielectric layer 117A) of the storage device (FIG. 1D). A high concentration of p-type dopant material is applied at the select gate implant region 123 and into the exposed second semiconductor layer 119A. A skilled artisan would readily consider an ion implantation technique for injecting the dopant at the select gate implant region 123 or other effective means for application of the high concentration p-type dopant material.

Figure 1F:
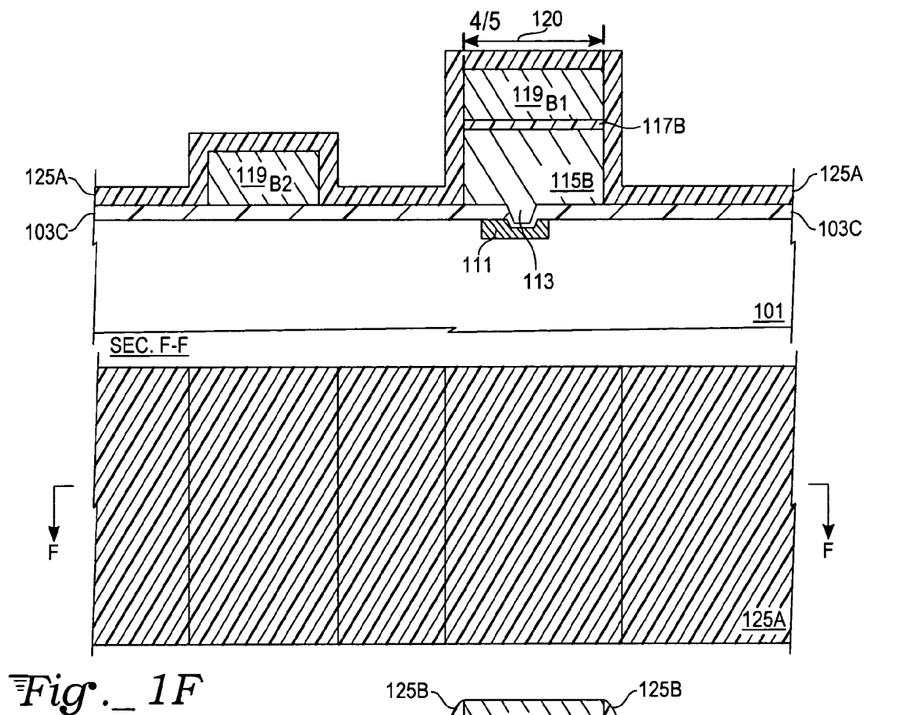

With reference to cross-section F-F of FIG. 1F, in the present exemplary embodiment, a fifth dielectric layer 125A is deposited in a conformal layer across an upper surface of the recessed first dielectric layer 103C and over a storage gate $119_{B1}$ and a select gate $119_{B2}$. From a just prior set of patterning and lithographic steps (not shown) a final etched structure of a floating gate 115B and an etched fourth dielectric layer 117B with a final gate length 120 is produced. The final gate length 120 dimension is less than the non-critical gate length 118 (FIG. 1D).

The second semiconductor layer 119A (FIG. 1E) is selectively patterned with photoresist and selectively etched (not shown) to form the storage gate $119_{B1}$ and the select gate $119_{B2}$. The select gate $119_{B2}$ is, for example, of high concentration p-type dopant material (FIG. 1E) due to the application of that material discussed supra. The fifth dielectric layer 125A layer also covers vertical sidewalls of the select gate $119_{B2}$ and the storage device formed by the storage gate $119_{B1}$, the etched fourth dielectric layer 117B, and the floating gate 115B. The fifth dielectric layer 125A may be selected from materials such as an oxynitride or ONO. The plan view of FIG. 1F has delineation noting conformal ridges in the fifth dielectric layer 125A of the oxynitride in the exemplary embodiment of the present invention.

Figure 1G:
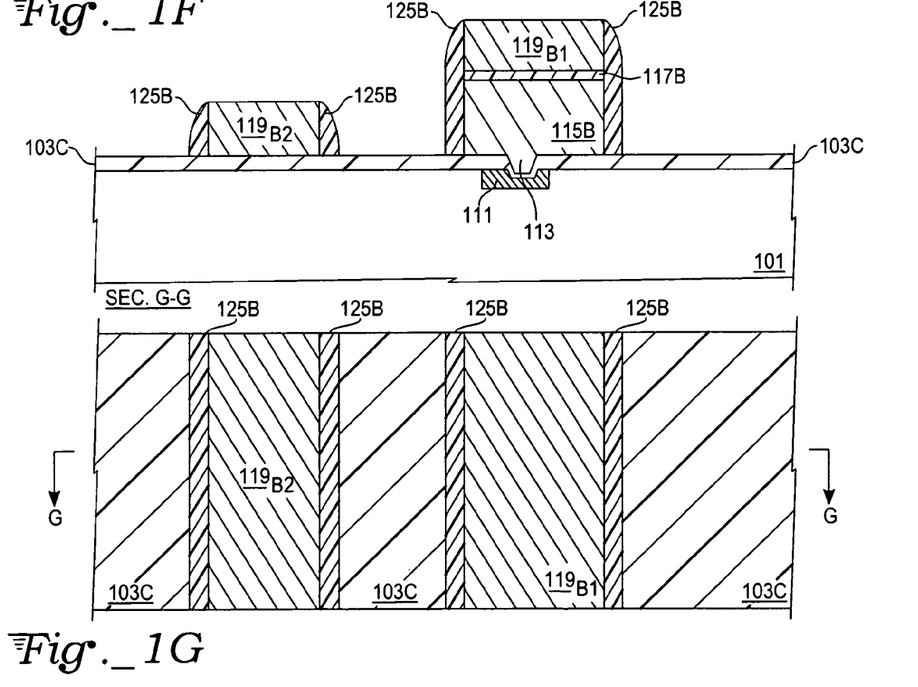

With reference to cross-section G-G of FIG. 1G, in the present specific exemplary embodiment a second spacer etch step removes the fifth dielectric layer 125A (for example, oxynitride) from essentially all horizontal surfaces. The spacer etching is achieved without substantially affecting an integrity of any other layer. With reference to the plan view of FIG. 1G, a plurality of dielectric spacers 125B about the sidewalls of the select gate $119_{B2}$ and the storage gate $119_{B1}$.

Figure 1H:
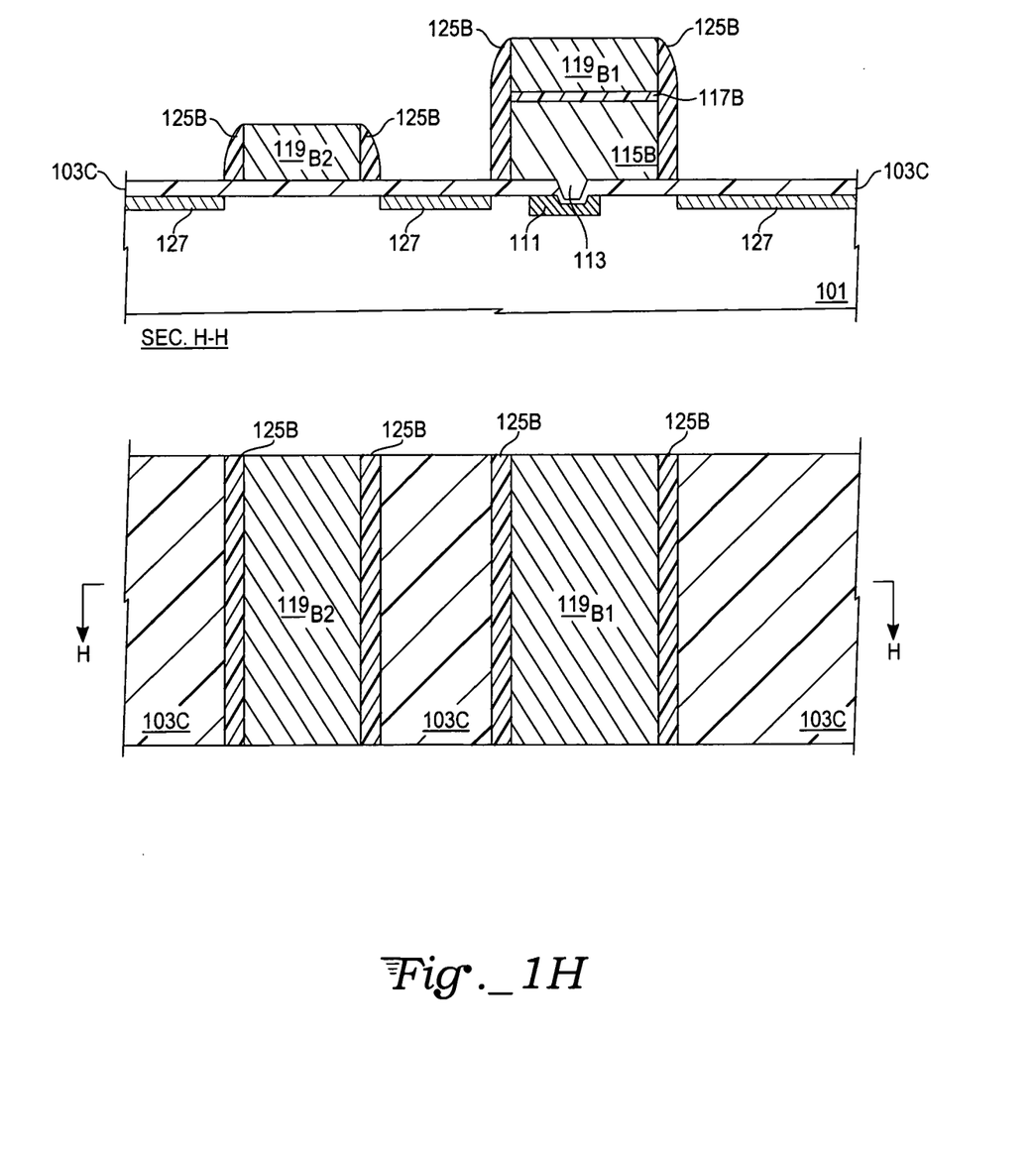

With reference to cross-section H-H of FIG. 1H, a high concentration n-type material is applied to the open regions of the recessed first dielectric layer 103C in the present exemplary embodiment. The high concentration n-type material forms a plurality of implant regions 127. Additionally the area of the select gate $119_{B2}$ is masked with a patterned photoresist before the n+-type material is applied, thus no dopant material reaches a select gate $119_{B2}$ The storage gate $119_{B1}$ is left unmasked and exposed to the application of the high concentration n-type material. After application of the high concentration n-type material, the select gate $119_{B2}$ is still composed of a high concentration p-type material and the storage gate 119B1 is composed of the high concentration n-type material. The select gate $119_{B2}$ being high concentration p-type material with source/drain diffusions (i.e., the two implant regions 127 adjacent to the select gate $119_{B2}$) of n+-type material, reduces the standby leakage current. The source/drain diffusions of n+-type material and the select gate $119_{B2}$ of p+-type material (in contrast to a typical NMOS device having a select gate of n+-type material) adjusts the work function between the regions to cause the reduction in the standby leakage current.

The fabrication processes employed and described with reference to FIGS. 1A-1H can be employed in advanced memory array design as described supra. While various semiconductor fabrication and processing techniques may be used to accomplish a similar result, the specific exemplary embodiment demonstrates particular fabrication processes capable of producing a tunnel window with an aperture size significantly in excess of what photolithography is capable of (i.e., significantly smaller size). Additionally, the present exemplary embodiment is a fabrication process of a EEPROM storage cell with a recessed tunnel window. The recessed tunnel window is produced with a spacer technique that allows a tunnel window of smaller dimensions and closer tolerances to adjacent features in a device channel. Together the smaller feature size and reduced tolerances produce a smaller storage cell size and a capability for the cell to be readily scalable.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that other types of semiconducting and insulating materials other than those listed may be employed. Additional particular process fabrication and deposition techniques, such as low pressure chemical vapor deposition (LPCVD), ultra-high vacuum CVD (UHCVD), and low pressure tetra-ethoxysilane (LPTEOS) may be readily employed for various layers and still be within the scope of the present invention. Although the exemplary embodiments describe particular types of dielectric and semiconductor materials, one skilled in the art will realize that other types of materials and arrangements of materials may also be effectively utilized and achieve the same or similar advantages. Also, the substrate itself may be comprised of a non-semiconducting material, for example, a quartz reticle with a deposited and doped polysilicon layer. Additionally, although the exemplary embodiments are described in terms of an EEPROM memory cell integrated circuit device, a person of ordinary skill in the art will recognize that other integrated circuit devices may readily benefit from the fabrication process described herein as well. The specification and drawings are, accordingly, to be regarded in an illustrative rather than a restrictive sense.

What is claimed is:

1. A method of fabricating an electronic integrated circuit device on a first surface of a substrate, comprising:
    forming a first dielectric film layer over the first surface of the substrate;
    forming an at least one further dielectric film layer over the first dielectric and creating a first aperture in the at least one further dielectric film layer, the first aperture having sidewalls that are non-parallel to the first surface of the substrate;
    forming spacers on the sidewalls of the first aperture such that a distance between spacers on opposing sidewalls of the first aperture is less than a limit of optical photolithography, the opposing spacers thus forming a second aperture;
    creating a dopant region formed substantially within an upper portion of the substrate underlying the first aperture; and
    etching a portion of the first dielectric film layer and an upper portion of the first surface of the substrate underlying the second aperture thus forming a tunneling window.

2. The method of claim 1, wherein the dopant region is formed by ion implantation.

3. The method of claim 1, wherein the dopant region is formed by diffusing a dopant species.

4. The method of claim 1, wherein the step of forming spacers on the sidewalls of the first aperture comprises:
    forming a spacer dielectric film layer over the at least one further dielectric film layer and a portion of the first dielectric film layer underlying the first aperture; and
    etching regions of the spacer dielectric film layer that are essentially parallel to the first surface of the substrate while leaving regions of the spacer dielectric film layer that are essentially perpendicular to the first surface of the substrate, thus creating spacers.

5. The method of claim 4, wherein the step of etching regions of the spacer dielectric film layer is performed by a reactive ion etch (RIE).

6. The method of claim 4, wherein the spacer dielectric film is chosen such that a chemical etching property of the spacer dielectric film layer is dissimilar to a chemical etching property of the first dielectric film.

7. The method of claim 1, wherein the substrate is substantially comprised of a p-type silicon wafer.

8. A method of fabricating an electronic integrated circuit device, comprising:
provoking a substrate, the substrate being substantially comprised of silicon and having a first surface;
forming a first dielectric film layer over the first surface of the substrate;
forming an at least one further dielectric film layer over the first dielectric film layer and creating a first aperture in the at least one further dielectric film layer, the first aperture having sidewalls that are non-parallel to the first surface of the substrate;
forming a spacer film layer over the at least one further dielectric film layer and a portion of the first dielectric film layer underlying the first aperture;
etching regions of the spacer film layer that are essentially parallel to the first surface of the substrate while leaving regions of the spacer film layer that are essentially perpendicular to the first surface of the substrate, the step of etching regions of the spacer film layer thus creating spacers on the sidewalls of the first aperture, a distance between spacers on opposing sidewalls of the first aperture is less than a limit of optical photolithography, the opposing spacers thus forming a second aperture;
creating a dopant region formed substantially within a portion of the substrate underlying the second aperture; and
etching a portion of the first dielectric film layer and an upper portion of the first surface of the substrate underlying the second aperture, thus forming a tunneling window.

9. The method of claim 8, wherein the step of etching regions of the spacer film layer is performed by a reactive ion etch (RIE).

10. The method of claim 8, wherein the first dielectric film layer is chosen such that a chemical etching property of the dielectric material is dissimilar to a chemical etching property of the at least one further dielectric film.

11. The method of claim 10, wherein the silicon substrate is substantially comprised of a p-type silicon wafer.

12. The method of claim 10, wherein the doped region is formed by ion implantation.

13. The method of claim 10, wherein the doped region is formed by diffusing a dopant species.

* * * * *